METHOD OF PRODUCING MESA TRANSISTORS AND OTHER SEMICONDUCTOR DEVICES HAVING PORTIONS OF REDUCED CROSS SECTION

Filed Aug. 13, 1963

United States Patent Office 3,243,319
Patented Mar. 29, 1966

3,243,319

METHOD OF PRODUCING MESA TRANSISTORS AND OTHER SEMICONDUCTOR DEVICES HAVING PORTIONS OF REDUCED CROSS SECTION

Josef Grabmaier and Erhard Sirtl, Munich, Germany, assignors to Siemens & Halske Aktiengesellschaft, Berlin, Germany, a German corporation Filed Aug. 13, 1963, Ser. No. 301,863
Claims priority, application Germany, Aug. 31, 1962, S 81,212
2 Claims. (Cl. 148—1.5)

Our invention relates to a method of producing mesa transistors and other electronic semiconductor devices having a crystalline semiconductor body possessing areas of reduced thickness or cross section.

According to the known method of producing such devices, a semiconductor body having originally uniform thickness is reduced in cross section either by mechanical means or by etching. When removing or eliminating portions of the semiconductor body by mechanical means, the semiconductor surface above all becomes contaminated by the tools. When performing an etching process, contamination of the semiconductor surface by the etching fluid is difficult to prevent. Furthermore, most etching agents do not attack the semiconductor body uniformly which is also detrimental in many cases to its ultimate electronic properties. The masking of semiconductor portions to prevent attack thereof by the etching agent, also often introduces impurities into the semiconductor surface from the masking material.

It is accordingly an object of our invention to devise a method of producing mesa-type semiconductor devices that eliminates the above-mentioned shortcomings.

According to our invention, we place upon the surface of the original crystalline semiconductor body a stencil which covers the surface portions at which the body is to be reduced in thickness and leaves the other portions bare. We then subject the semiconductor body with the stencil to a thermochemical transport reaction which removes semiconductor material from the semiconductor surface portions covered by the stencil and precipitates this material upon the bottom side of the stencil which thus becomes increasingly coated with the material removed from the semiconductor body.

The reaction zone in which the chemical transport reaction takes place is the gas-filled interspace between the semiconductor body and the adjacent stencil surfaces that cover the semiconductor body. The abrupt temperature change required for the transport reaction is preferably produced by the transfer of heat from the directly or indirectly heated semiconductor body to the bottom side of the stencil.

The transport mechanism will be hereinafter explained with reference to a semiconductor body of silicon.

A crystalline body of silicon, such as a plate or disc with planar surfaces is lapped at least at one surface, down to some residual minimum roughness which should not go below 3 to 5 microns (roughness depth). Such slight roughness is needed in order to subsequently secure a diffusion of the surrounding gas into the interstitial reaction zone and to maintain the necessary temperature difference between the higher temperature of the semiconductor body and the stencil heated from that body. Placed upon the lapped surface of the silicon body is a stencil which may consist of any heat-resistant material suitable as a recipient or carrier for the precipitating silicon. It is preferable, however, to use a stencil which consists of semiconductor material or is coated with semiconductor material at least at the surface facing the semiconductor body. It is particularly advantageous to employ for such a coating the same semiconductor material as that of the semiconductor body, and hence in the present case a coating of silicon. The core of the stencil which is coated with semiconductor material, may consist of ceramic or graphite, if desired. The stencil surface facing the semiconductor body should be planar and highly polished in order to promote uniform growth of the precipitating semiconductor substance and thereby uniform removal of the substance from the semiconductor body. The silicon body with the stencil on the top thereof is then placed on and heated by a suitable support, such as an electric resistance heater. A suitable transport-reaction temperature is approximately 1100° C. measured at the silicon body. When under these conditions the reaction space in which the assembly is located is supplied with a mixture of silicochloroform $SiHCl_3$ and hydrogen $H_2$, the gaseous mixture also penetrates into the narrow interspace between the stencil and the surface of the silicon body which is usually of monocrystalline constitution. The gaseous mixture located in the interstitial reaction space becomes greatly dissociated with the result that silicon is precipitated. Before a further amount of fresh gas can diffuse into the reaction space, the just-mentioned dissociation process develops from the gaseous mixture, which contains silicochloroform and hydrogen preferably in a ratio of approximately 0.03, to evolve hydrogen chloride in accordance with the equation $$SiHCl_3+H_2 \rightarrow Si+3HCl \tag{1}$$

The hydrogen chloride being formed in accordance with the equation $$SiCl_2+H_2 \underset{\text{high temperature}}{\overset{\text{low temperature}}{\rightleftarrows}} Si+2HCl \tag{2}$$

results in maintaining a concentration of the gaseous silicon sub-chloride $SiCl_2$, which, at a working temperature of about 1100° C., already reaches a considerable value. With increasing temperature the formation of $SiCl_2$ increases continuously. A silicon transport through the gaseous phase then becomes possible in the interspace in accordance with the equilibrium equation $$Si+2HCl \underset{\text{low temperature}}{\overset{\text{high temperature}}{\rightleftarrows}} SiCl_2+H_2 \tag{3}$$

and partially also in accordance with the equation $$Si+SiCl_4 \underset{\text{low temperature}}{\overset{\text{high temperature}}{\rightleftarrows}} 2SiCl_2 \tag{3a}$$

As a result of such a transport reaction and due to the endothermal character of this reaction, the elemental silicon precipitates at the locality of lower temperature. Consequently the silicon is transported from the heated body to the less heated bottom side of the stencil placed on top of the body. This produces a recess in the semiconductor body and hence the desired reduction in thickness or cross section.

The $SiCl_2$ partial pressure in this transport reaction increases with an increase in working temperature. Accompanied therewith is an increased silicon transport in accordance with Equation 2. At a $SiCl_2$ partial pressure of at least $10^{-6}$ atmospheres, this silicon transport is already of the same order of magnitude as is the precipitation of a silicon layer according to Equation 1 that occurs in the free gas space upon those surface portions of the semiconductor body that are not covered by the stencil. Consequently, the described method not only produces a reduction of cross section beneath the stencil-covered surface areas of the semiconductor body but simultaneously causes the precipitation of silicon on those areas that are left bare by the stencil.

In this way, by the introduction of a gaseous doping substance into the reaction gas mixture in the reaction vessel, simultaneously with the reduction in cross section, the method of this invention produces precipitation of layers possessing different conductance properties from those of the original semiconductor body, such as different specific resistance and/or different types of conductance i.e. n- or p-types. The precipitated layers have approximately the same thickness as that of the material removed by the transport reaction and grown upon the bottom side of the stencil. The method is applicable in an analogous manner for semiconductor bodies of other materials such as germanium, $A^{III}B^{V}$ and $A^{II}B^{VI}$ or similar semiconductor compounds.

For producing a mesa-type device from a semiconductor body of germanium, a stencil is placed on top of the original germanium plate and is coated with semiconductor material, preferably germanium, on the side facing the germanium body. The reaction vessel, in which the body with the stencil is supported on a heater, is supplied with a suitable transport-reaction gas, for example a mixture of germanium tetrachloride and hydrogen. Due to the resulting thermal dissociation of the mixture, the interstitial reaction space between the germanium plate and the stencil becomes enriched with hydrogen chloride. The hydrogen chloride then causes removal of germanium from the semiconductor body and precipitation of the germanium upon the bottom side of the stencil, while germanium is simultaneously caused to grow by dissociation and precipitation from the germanium tetrachloride upon the surface portions that are not covered by the stencil. When the germanium body is monocrystalline, the growth on the bare surface areas is also monocrystalline.

Gallium arsenide, when subjected to an analogous transport reaction method which includes the application of a stencil, is transported in the interspace, for example at a temperature of 850° C., in accordance with the equation $$GaCl + \tfrac{1}{2}H_2 + \tfrac{1}{4}As_4 \underset{\text{high temperature}}{\overset{\text{low temperature}}{\rightleftarrows}} GaAs + HCl \tag{4}$$

This gallium arsenide transport from the semiconductor body to the stencil increases with increasing temperature.

The method according to the invention may also be performed in such a manner that only removal of material from the semiconductor body by transport to the bottom side of the stencil takes place.

One way of limiting the process to the transport reaction in the interstitial space between semiconductor body and stencil is by not operating with a flowing gas system but rather by confining a given amount of gaseous mixture in an enclosed reaction system. For this purpose, the reaction vessel, after introducing the gaseous mixture, is closed and sealed; and a mixing ratio of the gases, which consist of a carrier gas or diluent and a halogen compound of the semiconductor substance to be transported, is so chosen that precipitation of the semiconductor substance takes place substantially only upon the bottom side of the stencil, thus reducing the thickness of the semiconductor body only beneath the stencil-covered surface portions and precipitating no semiconductor substance upon the uncovered surface portions.

Another way of producing a similar result is to mix only a hydrogen halide compound, for example HCl, with the carrier gas, such as hydrogen or argon, and to pass the mixture into the reaction vessel. When a flow of gas is permitted to pass through the reaction vessel during the process, then removal of semiconductor material also occurs at the free surfaces of the semiconductor body, i.e. the surfaces that are not covered by the stencil, and it is therefore necessary to so greatly dilute the hydrogen halide compound that as little as possible material is removed from the surfaces not covered by the stencil. Such removal from the bare surfaces, however, can be virtually entirely avoided if one were to operate with the aforementioned gaseous composition containing hydrogen halide and carrier gas, for example hydrogen, in a closed reaction vessel, which only removes semiconductor material at the surface portions covered by the stencil and accordingly precipitates that material upon the bottom side of the stencil in the course of the transport reaction.

To perform the method of the invention, the semiconductor body can be heated by directly passing electric current through the body. For this purpose, a rod- or slab-shaped semiconductor with terminals or electrodes at both ends may be heated in a manner known to those that are familiar with epitaxial techniques of semiconductor production. The semiconductor body may, however, also be heated indirectly by placing the same upon a heater consisting, for example of silicon carbide or of graphite coated with silicon carbide, and by directly passing electric heating current therethrough or by means of electrical induction heating. Suitable processing equipment is illustrated and described for example in the copending application of E. Sirtl (German priority of August 23, 1962; F–2578) to which reference may be had if desired.

The stencil employed in the method performed according to the invention may be made entirely of semiconductor material and particularly the same material as that of the semiconductor body. However, if the stencil is only coated with the semiconductor material, the core or carrier for the coating preferably consists of graphite or silicon carbide. Indeed, the stencil may also consist entirely of an inert material, for example highly pure graphite or spectral carbon. In the interest of preserving electronic purity in the semiconductor product, however, it is preferable to employ a stencil which consists of semiconductor material at least at the surface facing the semiconductor body.

The stencil can be provided with any number of openings of any desired shape. For that reason, the method according to the invention is also applicable to advantage for the production of solid state circuit assemblies or components of microcircuitry in which the active and passive components of an electric network are combined in a single semiconductor body. Furthermore, by subdividing the semiconductor body at the localities previously covered by the stencil during performance of the method of this invention, a plurality of substantially the same semiconductor devices can be produced, each possesing a semiconductor body having one or more portions of reduced cross section.

For further description of the invention, reference will be made in the following to an example of producing a mesa transistor of silicon in conjunction with the accompanying drawing in which.

Figure 1:
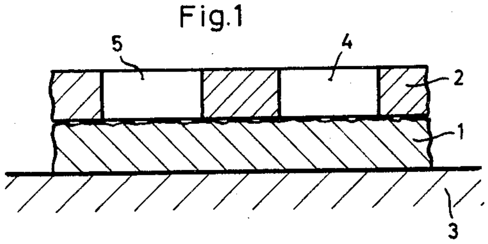
FIG. 1 shows schematically and in vertical section a representative fragment of a semiconductor body and stencil assembly prior to the transport reactions.

In FIG. 1 there is shown a plate-shaped semiconductor body 1 of silicon which is to be processed. The body 1 is first placed upon the top surface of a heater 3 and then covered with a stencil 2 which possesses several, for example circular, openings 4, 5 of the same size, only two of which are shown. The illustrated assembly is mounted in a reaction vessel (not shown). With the aid of the heater 3, the semiconductor body 1 is heated to the reaction temperature. Thereafter a gas mixture, such as silicochloroform and hydrogen, is fed into the reaction vessel. As explained in the foregoing, a transport reaction in the interspace between body 1 and stencil 2 then takes place and material is removed from the semiconductor body 1 which is preferably of monocrystalline constitution and is transported to the bottom surfaces of the stencil which cover the body areas. Simultaneously a monocrystalline layer of silicon is grown on those surface portions of the semiconductor body which are not covered by the stencil. By adding doping substances to the gaseous mixture, the layer thus grown upon the bare portions of the surface is doped to assume a conductance type, i.e. n- or p-type, opposed to that of the original semiconductor body 1.

Figure 2:
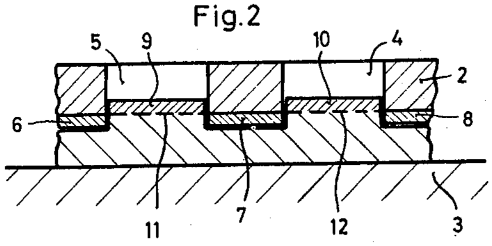
FIG. 2 shows the same assembly after completion of the process.

The resulting product is shown in FIG. 2. Semiconductor layers 6, 7, 8 have been grown on the bottom side of the stencil due to the chemical transport reaction. At these localities which are shown covered by the stencil 2, the semiconductor 1 now possesses recesses corresponding to the thickness of the transport layers 6, 7 and 8. Layers 9, 10 have been grown upon the bare surface areas of the semiconductor body 1 due to dissociation of the silicochloroform, and have been doped to exhibit a type of conductance opposed to that of the original semiconductor body. These layers 9 and 10 have approximately the same thickness as those grown on the bottom side of the stencil during the transport reaction, and constitute the base region of the mesa transistor. In this manner, an extremely pure p-n junction 11, 12 between the semiconductor body 1 and each epitaxially grown layer 9 and 10 is obtained. By severing the semiconductor body 1 at the portions previously covered by the stencil and having relatively small thickness, the product can be subdivided into a plurality of semiconductor units each having a portion of reduced cross section. This method thus affords simultaneous production of a large number of mesa transistors all having the same size and substantially the same properties.

Figure 3:
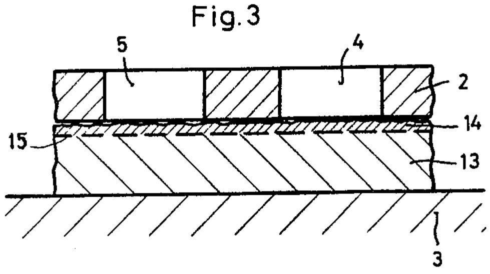
FIG. 3 shows, also in vertical section, a different embodiment of a semiconductor body and stencil assembly prior to performing the transport reaction.

FIG. 3 relates to a different mode of performing the method of this invention, in which the semiconductor body which is to be processed already possesses a p-n junction 15 substantially parallel to the surface covered by the stencil 2. The p-n junction is preferably produced by diffussing a doping substance into the semiconductor body. By applying suitable masking during diffusion or by etching away corresponding portions of the diffusion layer, a semiconductor body is obtained which consists of a region 13 having one type of conductance and a second region 14 resulting from the diffusion and having the opposed type of conductance. Using such a p-n junction body, the stencil 2 is placed upon the semiconductor surface formed by the diffusion layer. The method according to the invention is then performed in such a manner that virtually only the removal of material from the semiconductor body takes place and there is no precipitation upon the bare portions of the semiconductor surface. This manner of performing the method has already been described above.

Figure 4:
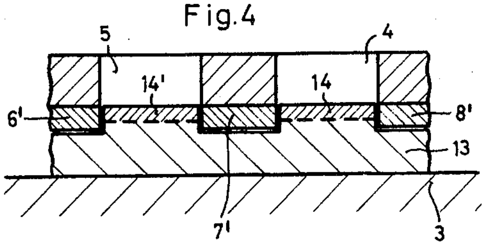
FIG. 4 shows the assembly of FIG. 3 after completion of the reaction.

FIG. 4 shows the same semiconductor body and stencil as shown in FIG. 3 after the semiconductor material has been removed during the chemical transport reaction. The semiconductor layers 6', 7' and 8' precipitated upon the bottom side of the stencil 2 have a greater thickness than that of the diffused layer 14. As a result, the p-n junction is exposed at the semiconductor surface around the peripheral area of the mesa. In the same manner, a plurality of p-n junctions extending substantially parallel to the original surface of the semiconductor body can be exposed by transport reaction. The surface areas around the mesas at which the p-n junction or junctions emerge are extremely pure and undisturbed. In such a case, too, a number of individual semiconductor devices can be made from the product by cutting it along lines that are parallel and perpendicular to the plane of illustration. Each mesa transistor is thereafter completed in accordance with the usual techniques, namely by adding vapor-deposited and alloy-bonded emitter and base electrodes and by attaching a collector electrode to the bottom side of the semiconductor body portion 13 serving as a collector.

The thickness of the layer of material removed from the semiconductor per unit time depends upon the gas composition and upon the temperature of the semiconductor body from which the material is to be removed. Consequently, the recesses and the height of the mesas to be produced can be adjusted to predetermined values by a corresponding choice of these parameters.

To those skilled in the art, it will be obvious, upon a study of this disclosure, that our invention permits of various modifications with respect to composition, materials and shape of components and hence can be given embodiments other than particularly illustrated and described herein, without departing from the essential features of our invention and within the scope of the claims annexed hereto.

We claim:

1. Method of producing mesa transistors and other semiconductor devices having portions of reduced cross section, which comprises placing a monocrystalline semiconductor body on a support, heating the semiconductor body in the presence of a reaction gas consisting of hydrogen and a gaseous compound of the semiconductor material to a temperature at which the material at the surface of the semiconductor body enters into a transport reaction with the reaction gas, covering the semiconductor body with a stencil formed with at least one opening therein and consisting of a material selected from the group consisting of graphite, silicon carbide and a ceramic stable at the reaction temperature and coated at least partly with semiconductor material on at least the side thereof facing the semiconductor body, and maintaining the reaction in a closed system so that the semiconductor body is gaseously etched away beneath the surfaces of the stencil during the transport reaction and the semiconductor material etched from the body is regrown on the area of the body exposed by the opening in the stencil whereby a semiconductor layer is formed on the semiconductor body having a cross section smaller than that of the semiconductor body.

2. Method according to claim 1 which includes introducing gaseous impurity as dopant to the system for selectively varying the conductance properties of the regrown semiconductor layer.

References Cited by the Examiner

UNITED STATES PATENTS

| | | | |
|---|---|---|---|
| 3,140,965 | 7/1964 | Reuschel | 148—175 |
| 3,156,591 | 11/1964 | Hale | 148—175 |
| 3,171,755 | 3/1965 | Reuschel | 148—1.5 |

OTHER REFERENCES

"Incorporation of Au Into Vapor Grown Ge." IBM Journal of Research and Development, volume 4, No. 3, July 1960, by W. E. Baker and D. M. Compton, pages 275 to 279.

"Self-Masking Semiconductor Junction Process," IBM Technical Disclosure Bulletin, by J. C. Marinace, volume 3, No. 8, January 1961, pages 29 and 30.

"Surface Effects and Autodoping in Epitaxial Germanium Layers," by E. Matovich et al., published by Semiconductor Development Laboratory, Hughes Aircraft Co., Sept. 29, 1961, pages 1–9.

HYLAND BIZOT, *Primary Examiner.*